United States Patent
Haas et al.

(10) Patent No.: US 9,293,706 B2
(45) Date of Patent: Mar. 22, 2016

(54) METHOD FOR ENCAPSULATING AN ORGANIC LIGHT EMITTING DIODE

(75) Inventors: Dieter Haas, San Jose, CA (US); John M. White, Hayward, CA (US); Byung-sung Leo Kwak, Portland, OR (US); Soo Young Choi, Fremont, CA (US); Jrjyan Jerry Chen, Campbell, CA (US); Jose Manuel Dieguez-Campo, Hanau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 13/366,109

(22) Filed: Feb. 3, 2012

(65) Prior Publication Data

US 2012/0208306 A1    Aug. 16, 2012

Related U.S. Application Data

(60) Provisional application No. 61/440,101, filed on Feb. 7, 2011.

(51) Int. Cl.
- *H01L 33/52* (2010.01)
- *H01L 51/00* (2006.01)
- *H01L 51/52* (2006.01)

(52) U.S. Cl.
CPC ......... *H01L 51/0014* (2013.01); *H01L 51/5253* (2013.01)

(58) Field of Classification Search
CPC .................. H01L 51/0014; H01L 51/5253
USPC .......................................................... 438/26
See application file for complete search history.

(56) References Cited

U.S. PATENT DOCUMENTS

| | | | |
|---|---|---|---|
| 7,302,309 B2 * | 11/2007 | Scott et al. | ..................... 700/166 |
| 7,387,537 B1 | 6/2008 | Daily et al. | |
| 7,387,557 B2 | 6/2008 | Kang et al. | |

(Continued)

FOREIGN PATENT DOCUMENTS

| | | |
|---|---|---|
| CN | 101325829 A | 12/2008 |
| CN | 101697343 A | 4/2010 |

(Continued)

OTHER PUBLICATIONS

PCT international search report and written opinion of PCT/US2012/023853 dated Sep. 27, 2012, PCT Search report provides the concise statement of relevance for KR-10-2010-0064870 and KR-10-2010-0090887.

Notice of First Office Action dated Jun. 30, 2015 for Chinese Application No. 201280007831.0.

*Primary Examiner* — Caleb Henry
*Assistant Examiner* — Mounir Amer
(74) *Attorney, Agent, or Firm* — Patterson & Sheridan, LLP

(57) ABSTRACT

Methods for encapsulating OLED structures disposed on a substrate using a soft/polymer mask technique are provided. The soft/polymer mask technique can efficiently provide a simple and low cost OLED encapsulation method, as compared to convention hard mask patterning techniques. The soft/polymer mask technique can utilize a single polymer mask to complete the entire encapsulation process with low cost and without alignment issues present when using conventional metal masks. Rather than utilizing a soft/polymer mask, the encapsulation layers may be blanked deposited and then laser ablated such that no masks are utilized during the encapsulation process.

16 Claims, 9 Drawing Sheets

(56) References Cited

U.S. PATENT DOCUMENTS

| | | |
|---|---|---|
| 7,495,252 B2 | 2/2009 | Ahn et al. |
| 7,521,857 B2 | 4/2009 | Kang et al. |
| 7,549,905 B2 | 6/2009 | Lee et al. |
| 7,919,396 B2 | 4/2011 | Ahn et al. |
| 2004/0251827 A1* | 12/2004 | Kang et al. ............ 313/512 |
| 2005/0212419 A1* | 9/2005 | Vazan et al. ............ 313/512 |
| 2005/0240299 A1 | 10/2005 | Scott et al. |
| 2007/0077849 A1 | 4/2007 | Chen et al. |
| 2007/0105473 A1 | 5/2007 | Lee et al. |
| 2008/0309650 A1* | 12/2008 | Nishikawa et al. ........ 345/206 |
| 2011/0171584 A1 | 7/2011 | Suh et al. |

FOREIGN PATENT DOCUMENTS

| | | |
|---|---|---|
| KR | 10-2010-0064870 | 6/2010 |
| KR | 10-2010-0090887 | 8/2010 |

* cited by examiner

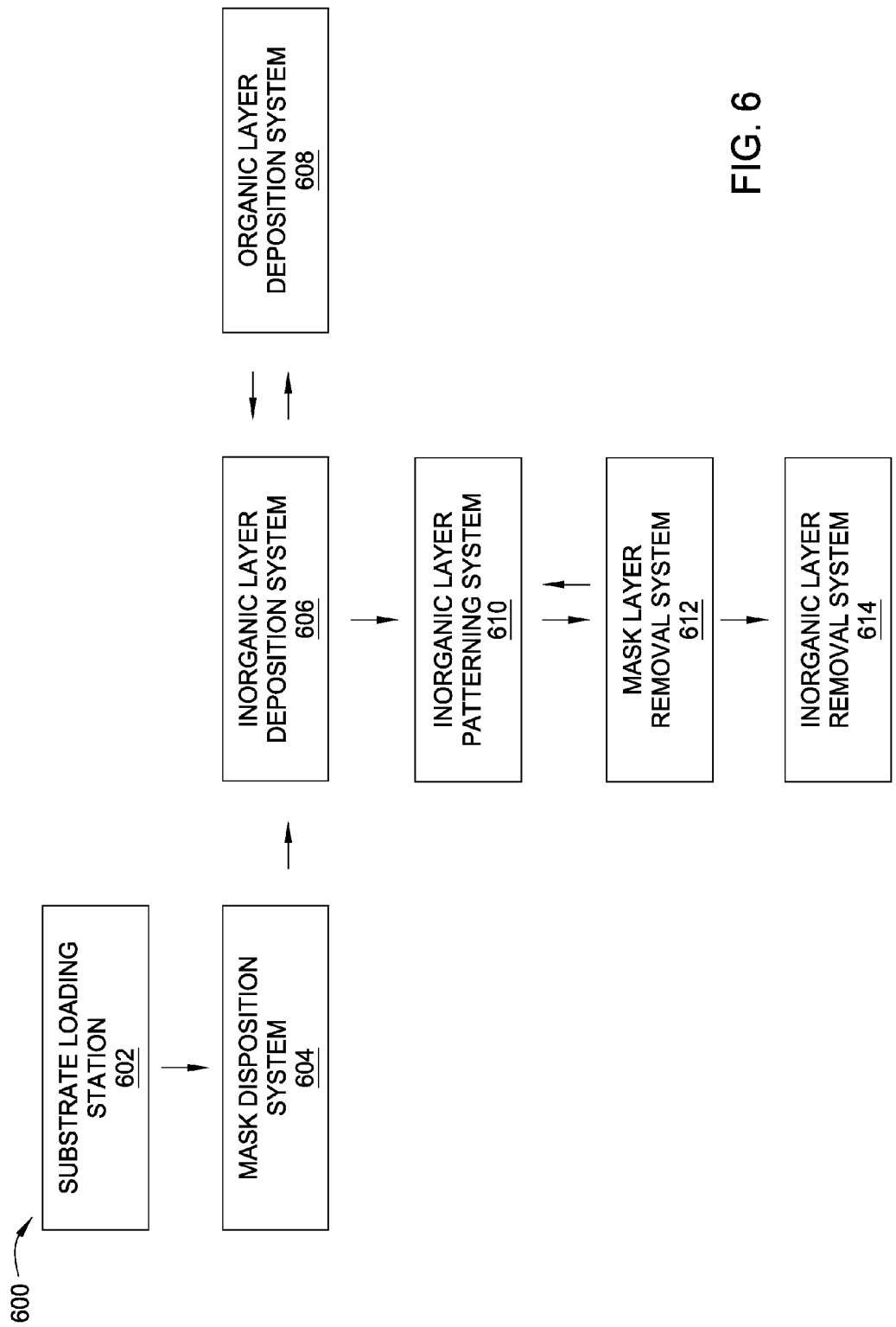

METHOD FOR ENCAPSULATING AN ORGANIC LIGHT EMITTING DIODE

CROSS-REFERENCE TO RELATED APPLICATIONS

This application claims benefit of U.S. Provisional Patent Application Ser. No. 61/440,101 (APPM/16101L), filed Feb. 7, 2011, which is herein incorporated by reference.

BACKGROUND

1. Field

Embodiments of the invention generally relate to a method for encapsulating an organic light emitting diode (OLED).

2. Description of the Related Art

OLED displays have gained significant interest recently in display applications due to their faster response time, larger viewing angles, higher contrast, lighter weight, low power and amenability to flexible substrates such as compared to liquid crystal displays (LCD). However, OLED structures may have a limited lifetime, characterized by a decrease in electroluminescence efficiency and an increase in drive voltage. A main reason for the degradation of OLED structures is the formation of non-emissive dark spots due to moisture or oxygen ingress. For this reason, OLED structures are typically encapsulated by an organic layer sandwiched between inorganic layers. The organic layer is utilized to fill any voids or defects in the first inorganic layer such that the second inorganic layer has a substantially uniform surface or deposition.

FIGS. 1A-1C illustrate a conventional process for depositing the encapsulating layers, typically including a first inorganic layer 106 (shown as 106a and 106b), an organic layer 108 (shown as 108a and 108b) and a second inorganic layer 116 (shown as 116a and 116b). The process begins by aligning a first mask 109 over the substrate 100 such that the OLED structure 104 is exposed through an opening 107 unprotected by the mask 109, as shown in FIG. 1A. The first mask 109 defines the first opening 107 having a first distance 110 from the OLED structure 104 to the edge of the first mask 109. The masks 109, 114 are typically made from a metal material, such as INVAR®. As illustrated in FIG. 1A, the first mask 109 is utilized to pattern the first inorganic layer 106 (shown as 106a, 106b), such as silicon nitride or aluminum oxide, over the OLED structure 104. The first mask 109 is positioned such that a portion 105 of the contact layer 102 adjacent to the OLED structure 104 is covered by the first mask 109 such that the inorganic layer 106 does not deposit on that region 105. As illustrated in FIG. 1B, the first mask 109 is removed and replaced by a second mask 114 having an opening 111 smaller than the opening of the first mask 109. The second mask 114 defines the second opening 111 having second distance 112, which is shorter than the first distance 110 as defined by the first mask 109, from the OLED structure 104 to the edge of the second mask 114. By utilizing the second mask 114, an organic layer 108 (shown as 108a, 108b) is deposited over the first inorganic layer 106. As the second mask 114 has the opening 111 smaller than the first mask 109, the organic layer 108 does not completely cover the underlying inorganic layer 106. The encapsulation of the OLED structure 104 is finished by depositing at least a second inorganic layer 116 (shown as 116a and 116b) over the top of the exposed portion of the first inorganic layer 106 and the organic layer 108 utilizing the first mask 109 unprotected by the first mask 109 as illustrated in FIG. 1C. The second inorganic layer 116 fully encapsulates the organic layer 108 with the first inorganic layer 106, thereby encapsulating the OLED structure 104 while leaving the portion 105 of the contact layer 102 exposed.

The conventional process flow described above has significant challenges preventing commercially viable scaling for use with larger area substrates, such as substrates having a top plan area greater than about 1,500 centimeters square. For example, the two metal masks 109, 114 required for implementing the above described process for such large area substrates are very expensive, and may each exceed $40,000.00 in cost. Additionally, very tight alignment tolerance of the metal mask 109, 114 to the OLED structure 104 is required, generally within 100 µm. As these masks 109, 114 often exceed 1.00 meter in length, the masks 109, 114 undergo significant thermal expansion when heated from ambient temperatures to processing temperatures of about 80 degrees Celsius. This significant thermal expansion provides a major challenge for OLED fabricators as to how to prevent alignment loss between the openings 107, 111 formed through the masks 109, 114 and the OLED structure 104. Loss of alignment may result in incomplete encapsulation of the OLED structure 104, which in turn leads to shortened life and diminished performance of the OLED device 104.

Therefore, there requires an improved method and apparatus for encapsulating an OLED structure.

SUMMARY

The present disclosure provides methods and apparatus for encapsulating OLED structures disposed on a substrate using a soft/polymer mask technique or without utilizing a mask at all. The soft/polymer mask technique can efficiently provide a simple and low cost OLED encapsulation method, as compared to convention hard mask patterning techniques. In one embodiment, the soft/polymer mask technique can utilize a single polymer mask to complete the entire encapsulation process with low cost and without alignment issues present when using conventional metal masks. When utilizing no mask at all, the encapsulating layers are blanket deposited over the substrate. Thereafter, laser ablation is utilized to remove the encapsulating layer from over a portion of the contact layer so that the portion of the contact layer is exposed.

In one embodiment, a method for forming an encapsulating layer on an OLED substrate is disclosed. The OLED structure is formed on a first region of a substrate. The method includes disposing a polymer mask on a second region of the substrate, forming a first inorganic layer on the polymer mask disposed on the second region and on the first region of the substrate, forming an organic layer on a portion of the first inorganic layer disposed on the second region of the substrate, forming a second inorganic layer on the first inorganic layer disposed on the second region of the substrate and the organic layer, and performing a polymer mask removal process to remove the polymer mask from the substrate.

In other embodiments, the polymer mask removal process may include ashing or dissolving the polymer mask in solution. In some embodiments, the polymer mask removal process may include forming an opening in the first and the second inorganic layers disposed on the polymer mask, ashing or dissolving the polymer mask in solution a shell leaving comprised of first and the second inorganic layer, and performing a shell removal process to remove the shell from the substrate.

In another embodiment, method for encapsulating a substrate having an OLED structure formed thereover is disclosed. The method comprises depositing one or more encapsulation layers over the OLED structure, the substrate, and a contact layer that is disposed between the OLED structure and the substrate such that a first portion of the contact layer extends from between the OLED structure and the substrate and the OLED structure is disposed over a second portion of the contact layer. The method also comprises laser ablating the one or more encapsulation layers that are disposed over the first portion of the contact layer to expose the first portion of the contact layer.

In another embodiment, a method for encapsulating a substrate having an OLED structure formed thereover is disclosed. The method includes depositing a first inorganic encapsulation layer over the OLED structure, the substrate, and a contact layer that is disposed between the OLED structure and the substrate such that a first portion of the contact layer extends from between the OLED structure and the substrate and the OLED structure is disposed over a second portion of the contact layer. The method also includes depositing an organic encapsulation layer over the first inorganic encapsulation layer, depositing a second inorganic encapsulation layer over the organic encapsulation layer and laser ablating the second inorganic encapsulation layer, the organic encapsulation layer and the first inorganic encapsulation layer that are disposed over the first portion of the contact layer to expose the first portion of the contact layer.

In another embodiment, a method for encapsulating a substrate having an OLED structure formed thereover is disclosed. The method includes depositing, on the substrate having the OLED structure formed on a first region and a second region having an exposed contact layer, a polymer mask on the second region of the substrate. The method also includes forming a first inorganic layer on the polymer mask disposed on the second region and the first region of the substrate, depositing an organic layer on the second region of the substrate while the polymer mask is disposed on the second region of the substrate, forming a second inorganic layer on the first inorganic layer; and removing the polymer mask from the second region of the substrate to expose the contact layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6 is a schematic illustration of a production line suitable for encapsulating OLED structures in accordance with one embodiment of the present invention;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides methods and apparatus for encapsulating OLED structures disposed on a substrate by a soft/polymer mask technique or without utilizing a mask at all. The soft/polymer mask OLED encapsulation technique efficiently provides a simple and low cost encapsulating method, as compared to conventional hard mask techniques that utilized expensive metal masks. In one embodiment, the soft/polymer mask technique can utilize a single polymer mask for the complete encapsulating process with low cost and without alignment issues present in conventional processes. When utilizing no mask at all, the encapsulating layers are blanket deposited over the substrate. Thereafter, laser ablation is utilized to remove the encapsulating layer from over a portion of the contact layer so that the portion of the contact layer is exposed.

Soft/Polymer Mask Technique

Figure 2:
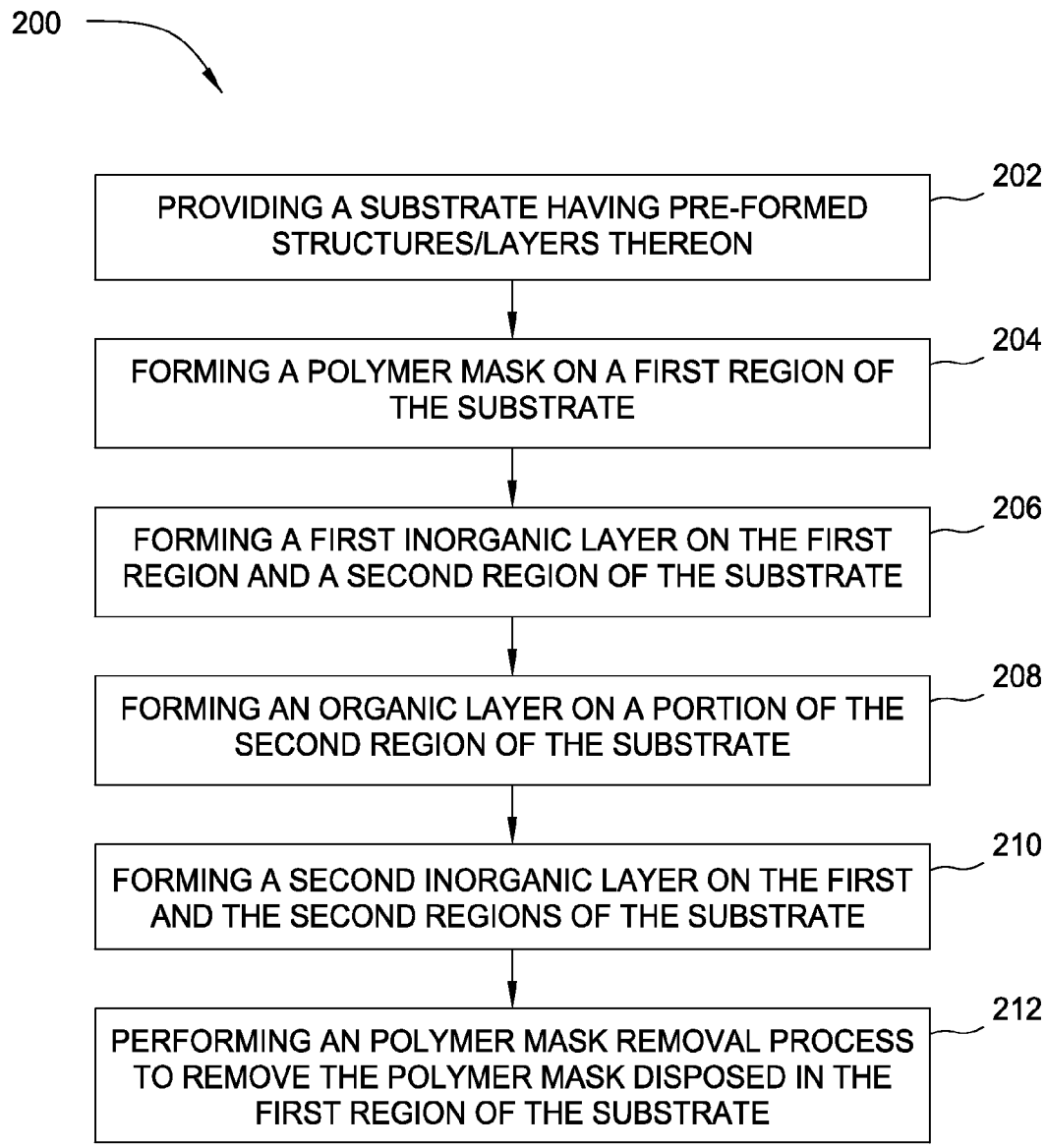
FIG. 2 is a flow diagram of a method for encapsulating an OLED structure in accordance with one embodiment of the present invention.
Figure 3A:
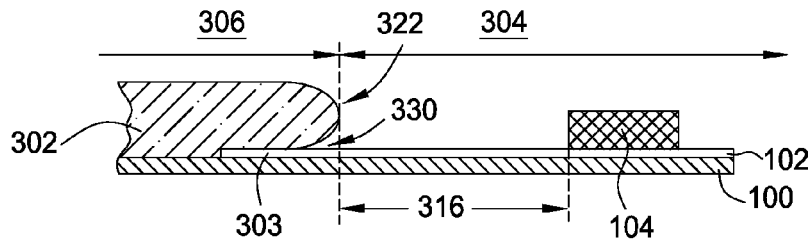
FIGS. 3A-3G illustrate schematic cross-sectional views of an OLED structure during different stages of the method of FIG. 2.

FIG. 2 is a flow diagram of a method 200 for encapsulating an OLED structure disposed on a substrate. FIGS. 3A-3G illustrate schematic cross-sectional views of an OLED structure during different stages of the encapsulation method 200 of FIG. 2. The encapsulating method 200 starts at step 202 by providing a substrate having a preformed OLED structure 104 disposed on a substrate 100. Similar to as discussed above, the substrate 100 may have a contact layer 102 disposed thereon, with an OLED structure 104 disposed on the contact layer 102, as shown in FIG. 3A.

At step 204, a polymer mask 302 is disposed on a first region 306 of the substrate 100, leaving a second region 304 of the substrate exposed for subsequent deposition. The polymer mask 302 disposed on the first region 306 of the substrate 100 covers a portion 303 of the contact layer 102 and shields the portion 303 from deposition. The polymer mask 302 may be spaced from the OLED structure 104 by a distance 316. The polymer mask 302 may be deposited on the substrate 100 by a spin coating/lithography process, a spray process, a inkjet process, a slot deposition process, or other suitable process that may form the polymer mask on the desired first region 306 on the substrate 100, as shown in FIG. 3A.

The material utilized for the polymer mask 302 is a polymer material suitable for functioning as a mask during a SiN chemical vapor deposition process which can later be removed by ashing or by exposure to a dissolving solution. In one embodiment, the material utilized for the polymer mask 302 is suitable for deposition on the substrate by an inkjet or slot deposition process.

In one embodiment, the material utilized for the polymer mask 302 is has a low wetting propensity and/or high surface tension when in contact with the contact layer 102. The low wetting propensity and/or high surface tension of the polymer mask 302 causes the polymer mask 302 to have a rounded end 322. The underside of rounded end 322 defines an overhanging portion 330 with the contact layer 102 which is shielded by the rounded end 322 from deposition materials during subsequent processing.

Figure 3B:
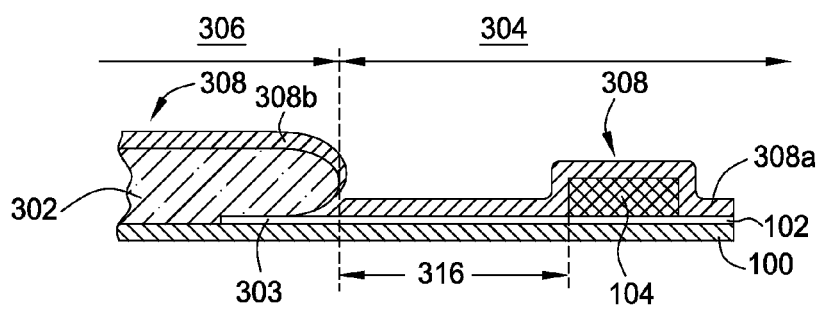

At step 206, a first inorganic layer 308 is deposited on the substrate 100, as shown in FIG. 3B. The first inorganic layer 308 has a first portion 308a and a second portion 308b. The first portion 308a of the first inorganic layer 308 is deposited on the second region 304 of the substrate 100 exposed by the polymer mask 302. The second portion 308b of the first inorganic layer 308 is deposited on the first region 306 of the substrate 100, covering an upper surface of the polymer mask 302. The first inorganic layer 308 is a dielectric layer selected from a group consisting of SiN, SiON, $SiO_2$, $Al_2O_3$, AlN, or other suitable dielectric layers. The first inorganic layer 308 may be deposited by any suitable deposition techniques, such as CVD, PVD, spin-coating, or other suitable technique.

Figure 1A:
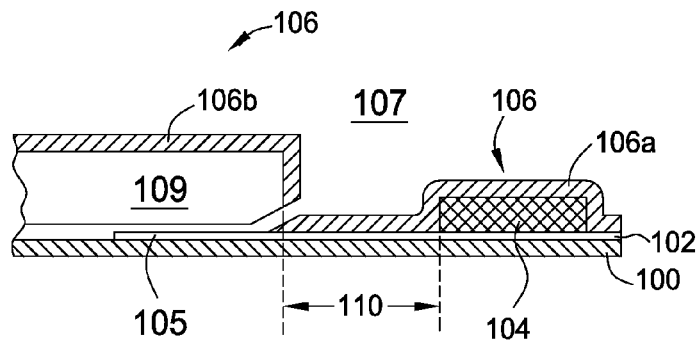
FIGS. 1A-1C illustrate schematic cross-sectional views of an OLED structure during different stages of a conventional encapsulation sequence known in the art.
Figure 1B:
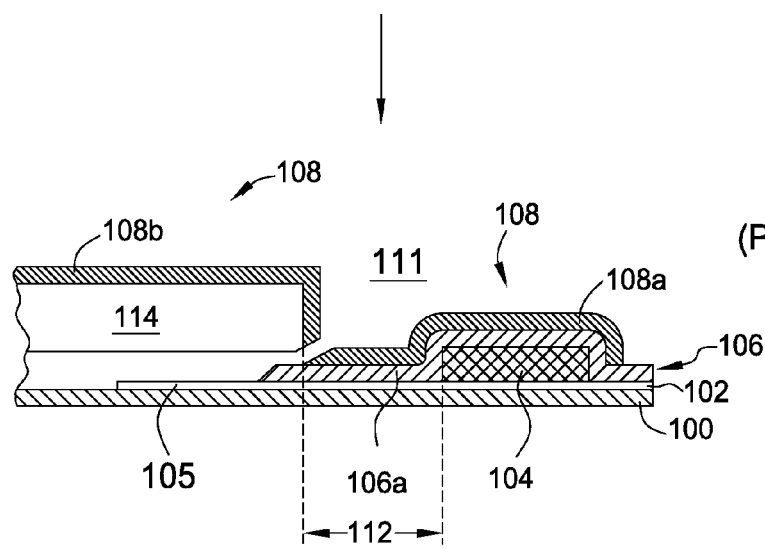
Figure 1C:
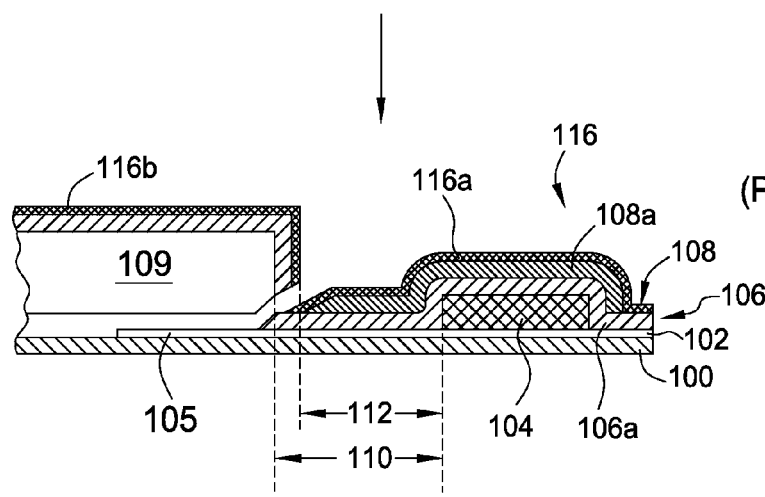
Figure 3C:
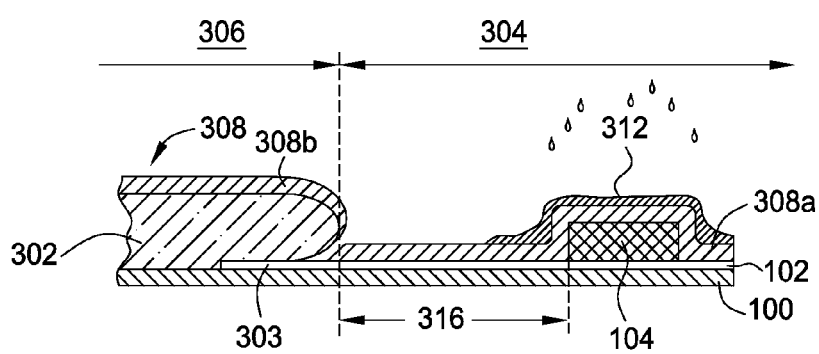

At step 208, after the first inorganic layer 308 is formed on the substrate 100, an organic layer 312 is then formed on the first inorganic layer 308 on the substrate 100, as shown in FIG. 3C. The organic layer 312 may be disposed on the substrate 100 in a predefined region of the substrate 100 inward and spaced from the edge of the polymer mask 302, such as on the top of the OLED structure 104 in the second region 304 of the substrate 100. In one embodiment, the organic layer 312 may be deposited by a direct deposition technique which does not require masking, such as inkjet deposition, slot deposition and the like. Alternatively, the organic layer 312 may be formed on the entire surface of the substrate 100 and followed by a patterning process, leaving the organic layer 312 only on the desired region, such as on the top of the OLED structure 104. Alternatively, the organic layer 312 may be deposited on the substrate 100 using a conventional masking technique, such as described with reference to FIG. 1B. The organic layer 312 may be an organic material selected from at least one of acrylate, a methacrylate, acrylic acid, hexamethyldisiloxane (HMDSO) or mixture thereof.

Figure 3D:
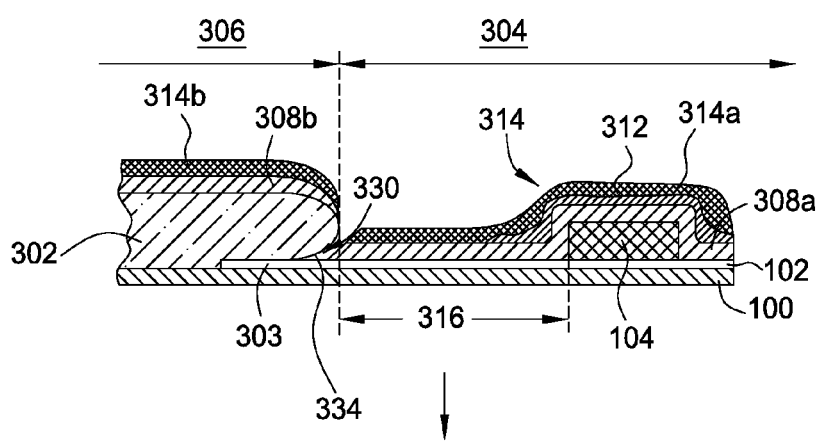

At step 210, a second inorganic layer 314 is formed on the substrate 100, encapsulating the organic layer 312 and the first organic layer 308 formed on the OLED structure 104, as shown in FIG. 3D. The second inorganic layer 314 includes a first portion 314a deposited over the organic layer 312 and a second portion 314b deposited over the second portion 308b of the first inorganic layer 308.

The second inorganic layer 314 may be a dielectric layer similar to the first inorganic layer 308. The second inorganic layer 314 is a dielectric layer selected from a group consisting of SiN, SiON, $SiO_2$, or other suitable dielectric layers. The second inorganic layer 314 is a dielectric layer selected from a group consisting of SiN, SiON, $SiO_2$, or other suitable dielectric layers. The second inorganic layer 314 may be deposited by any suitable deposition techniques, such as CVD, PVD, spin-coating, or other suitable technique.

The second inorganic layer 314 may be deposited on the substrate 100 using the same polymer mask 302 utilized to deposit the first inorganic layer 308. Thus, the polymer mask 302 does not have to be changed or removed during the encapsulation sequence.

At step 212, a polymer mask removal process is performed to remove the polymer mask 302 from the substrate 100. The polymer mask removal process may be a dry (plasma) process or a wet process. In one embodiment, the polymer mask 302 is removed from the substrate 100 by an ashing process, such as by exposure to an oxygen containing plasma. In another embodiment, the polymer mask 302 is removed from the substrate 100 by dissolving the polymer mask 302 in a liquid. In one embodiment, the liquid is water.

The polymer mask removal process of step 212 may take advantage of bare polymer mask material 334 exposed by the overhanging portion 330 (i.e., not covered by second portion 308b and/or the second portion 314b during the previous deposition steps) of the polymer mask 302 as an entry site to which the reactive species/chemicals of the wet or dry process may attack and remove the polymer mask 302.

Figure 3E:
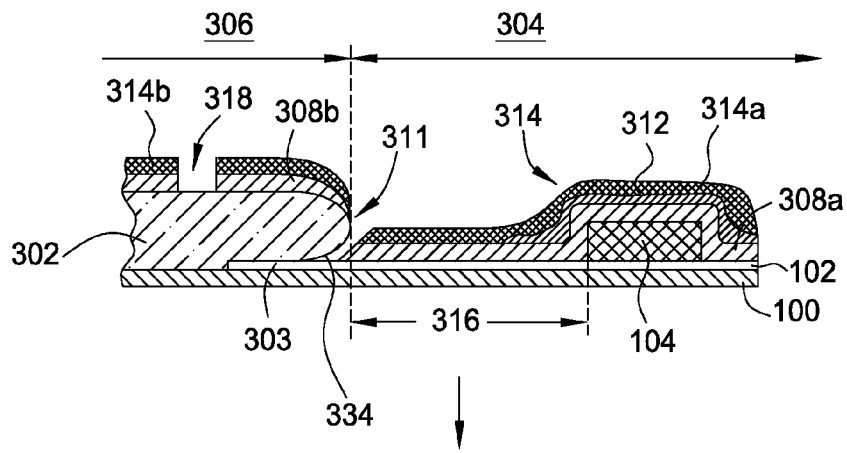
Figure 3F:
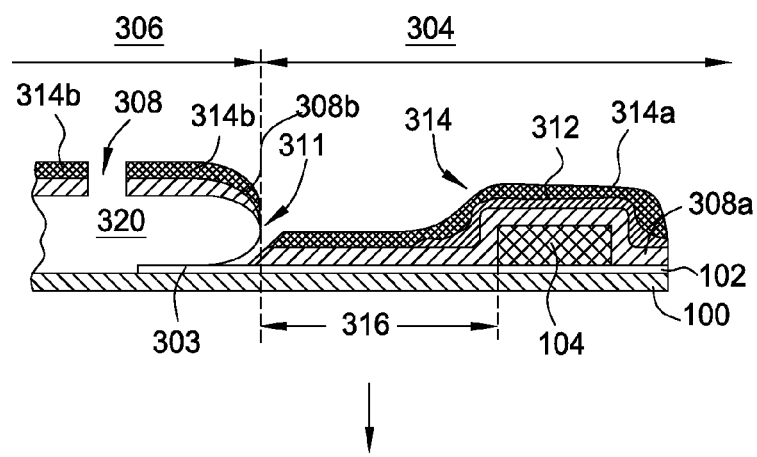
Figure 3G:
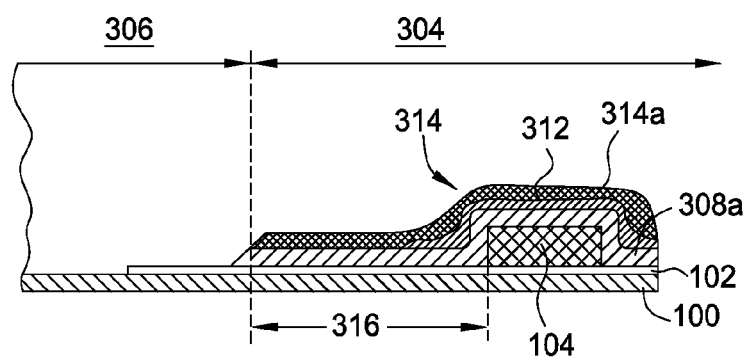

Alternatively, the polymer mask removal process of step 212 may utilize a patterning process to forming an opening 318 in an inorganic shell 311 formed by the first and the second portions 308b, 314b of the inorganic layer formed on the substrate 100, as shown in FIG. 3E. The patterning process may form the opening 318 by a suitable patterning technique, such as etching, including dry etching or wet etching, laser ablation, or other suitable technique. The opening 318 exposes bare polymer mask material 334. The bare polymer mask material 334 may subsequently be removed by reactive species/chemicals of a wet or dry process. Once the polymer mask 302 has been removed, the inorganic shell 311 having an empty space 320 (defined where the polymer mask 302 once was) may remain on the substrate 100, as shown in FIG. 3F.

If an inorganic shell 311 is present after the polymer mask 302 has been removed from the substrate 100, the polymer mask removal process of step 212 may further include shell removal process. The shell removal process may be a blasting process, an etching process, a laser ablation process, a plasma process, a treatment process, or other suitable process. In one embodiment, the blasting process may include striking the inorganic shell 311 with a particulate, such as frozen CO.

Figure 4:
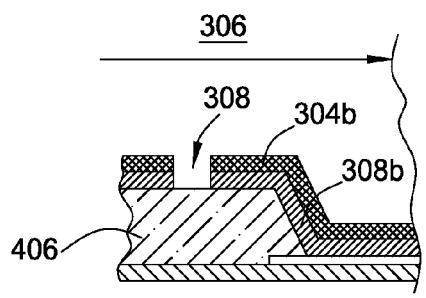
FIG. 4 is a schematic cross-sectional view of encapsulating OLED structure formed on the substrate in accordance with another embodiment of the present invention.

FIG. 4 depicts another embodiment of utilizing a polymer mask layer 406 disposed on the first region 306 of the substrate 100. Different from the embodiment depicted in FIGS. 3A-3G, the polymer mask 406 may be formed in substantially rectangular or trapezoid shape to facilitate transfer desired features onto the substrate 100. As the polymer mask 302 depicted in FIGS. 3A-3G has a droplet shape, stray first and/or second inorganic layer 308, 314 inadvertently cover the portion 105 of the contact layer 102. Accordingly, the edge of the polymer mask 406 facing the OLED structure 104 is in contact with the contact layer 102 to ensure a crisp termination of the inorganic layer 308, 314 after fabrication.

The polymer mask 406 is deposited and removed as described above with reference to FIGS. 2, 3A-G, except wherein as there is no overhanging portion 330 on the polymer mask 406, the polymer mask 406 is moved by forming an opening 318 to expose bare polymer mask material 336 to facility removal of the polymer mask 406 by a dry or wet process, followed by shell removal, if required, as depicted in FIGS. 3E-3G.

Figure 5A:
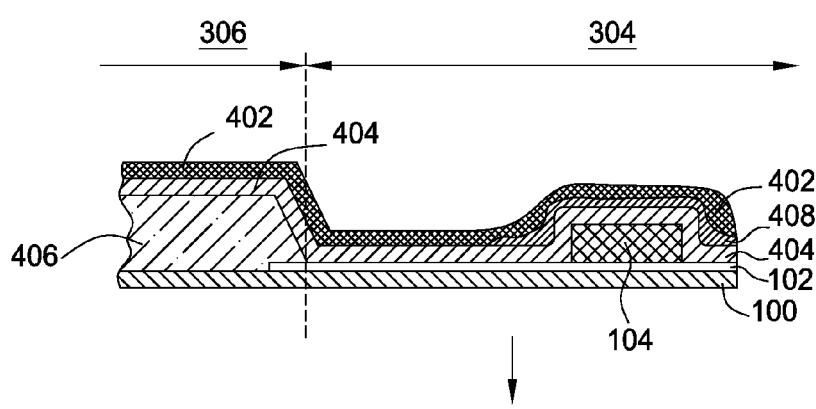
FIGS. 5A-5E illustrate schematic cross-sectional views of an OLED structure during an encapsulation sequence in accordance with another embodiment of the present invention.

FIGS. 5A-5E illustrate schematic cross-sectional views of encapsulating OLED structures in accordance with another embodiment of the present invention. Similar to the encapsulating method 200 depicted above with referenced to FIGS. 3A-3G, the substrate 100 has the first region 306 configured to be protected under the trapezoid polymer mask 406 and the second region 304 readily to form the OLED structure 104 with the desired encapsulation, including the first inorganic layer 404, the organic layer 408 and the second inorganic layer 402, as shown in FIG. 5A. Similarly, the first inorganic layer 404 and the second inorganic layer 402 are similar to the first and the second inorganic layer 308, 314 and the organic layer 408 may be similar to the organic layer 312 discussed above with referenced to FIGS. 3B-3F.

Figure 5B:
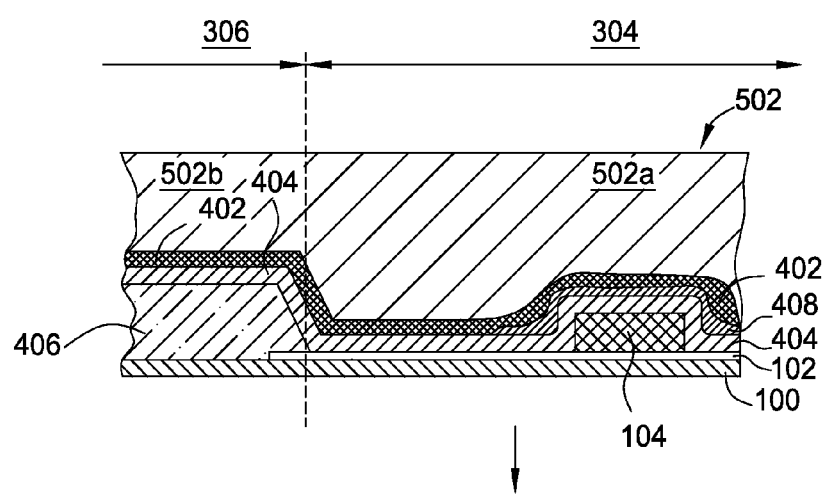

Subsequently, an organic layer disposition process is performed to coat an organic covering layer 502 across the surface of the substrate 100 including the first and the second region 306, 304 of the substrate 100, as shown in FIG. 5B. The organic covering layer 502 may be spin-coated, spray coated, inkjet, block (slot die) coating, or other suitable deposition and/or coating techniques to deposit the organic layer 312 on the substrate 100. The organic layer 312 may be an organic material selected from at least one of acrylate, a methacrylate, acrylic acid, hexamethyldisiloxane (HMDSO) or mixture thereof. The organic covering layer 502 is configured to protect the entire surface of the substrate 100. The organic covering layer 502 includes a first portion 502a deposited on the first region 306 of the substrate 100 and a second portion 502b deposited on the second region 304 of the substrate 100.

Figure 5C:
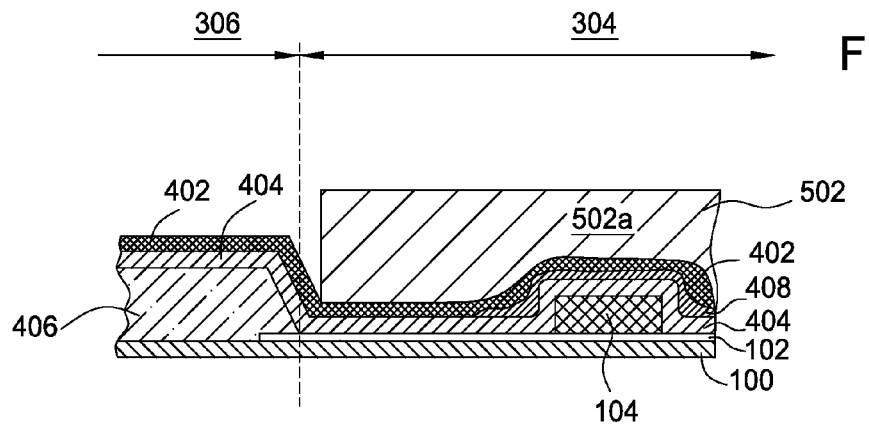

A first patterning process is the performed to remove the second portion 502b of the organic covering layer 502 from the first region 306 of the substrate 100, while the first portion 502a of the organic covering layer 502 remains substantially intact over the second region 304 of the substrate 100, as shown in FIG. 5C. As the organic covering layer 502 is a polymer material, therefore, any suitable polymer removal technique, such as ashing process, oxygen purge process, laser ablation process, etching process, water dissolution, immersing in dissolving solution, liquid or air spraying, or any suitable processes, may be utilized to remove second portion 502b of the organic covering layer 502.

Figure 5D:
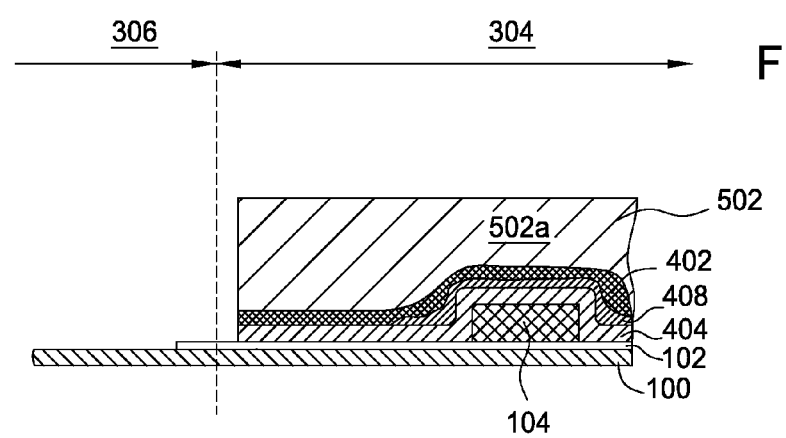

Subsequently, a polymer mask removal process is performed to remove the polymer mask 406 from the substrate 100 along with the first 404 and the second inorganic layer 402 disposed thereon from the first region 306 of the substrate, as shown in FIG. 5D. As the polymer mask 406 is a polymer material and the first and the second inorganic layers 402, 404 are dielectric layer, the chemicals selected to remove the polymer mask 406 and the first and the second inorganic layers 402, 404 should be strong or aggressive enough to remove both the organic and the inorganic material formed in the first region 306 of the substrate 100. In one embodiment, the polymer mask removal process may be a dry etching process that utilizes a halogen containing etchant and/or oxygen containing etchant to remove both the organic and the inorganic material formed in the first region 306 of the substrate 100. In another embodiment, the polymer mask removal process may be a wet etching process that utilizes fluorine, a strong acid or base solution to remove both the organic and the inorganic material formed in the first region 306 of the substrate 100. Any suitable techniques that may be able to remove both the organic and the inorganic material formed in the first region 306 of the substrate 100 may also be utilized as needed.

Figure 5E:
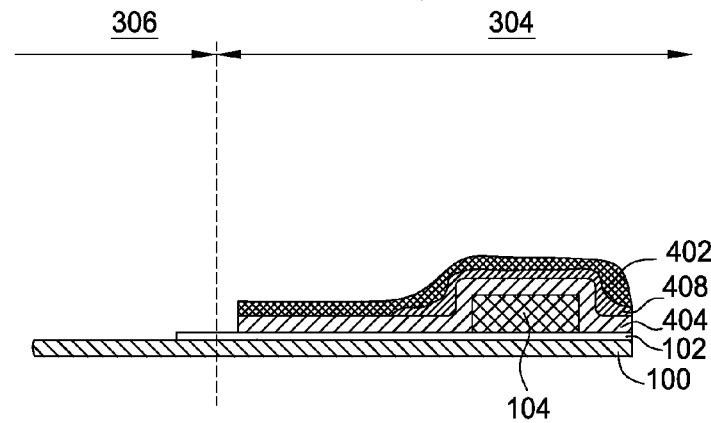

In a final step, the remaining first portion 502a of the organic covering layer 502 is then removed from the second region 304 of the substrate 100, leaving the desired OLED structure 104 with proper encapsulation, including the first inorganic layer 404, the organic layer 408 and the second inorganic layer 402 on the second region 304 of the substrate 100, as shown in FIG. 5E.

FIG. 6 depicts one embodiment of a production line 600 that may be utilized to encapsulate OLED structures in accordance with one embodiment of the present invention. As discussed above with reference to FIG. 2, a substrate 100 having an OLED structure 104 formed thereon may be first loaded to a substrate loading station 602. The substrate 100 is transferred from the substrate loading station 602 to a polymer mask deposition system 604. As discussed above, the polymer mask 302, 406 may be disposed on a desired first region 306 of the substrate 100 with desired shapes to facilitate forming proper encapsulation on a desired second region 304 of the substrate 100 in the polymer mask deposition system 604. In one embodiment, the polymer mask deposition system 604 is a direct deposition system, such as an inkjet deposition system or a slot deposition system, among others.

The substrate 100 having the polymer mask deposited thereon is then transferred to an inorganic layer deposition system 606 to form the first inorganic layer 308, 404 on the substrate 100. As discussed above, the inorganic layer deposition system 606 may be a blanket deposition system, such as PVD or PECVD and the like. Alternatively, the inorganic layer deposition system 606 may be a blanket deposition system which deposits the first inorganic layer 308, 404 across the entire surface of the substrate. In the event that a blanket deposition system is utilized, a patterning system is utilized in tandem to leave the organic layer only covering the desired region on the top of the OLED structure 104.

The substrate 100 having the first inorganic layer 308, 404 disposed thereon is transferred to an organic layer deposition system 608 to deposit the organic layer 312, 408. The organic layer deposition system 608 is a direct deposition system such that the organic layer 312, 408 may be deposited on the substrate 100 laterally spaced inward (towards the OLED structure 104) from the polymer mask 302, 406 with the polymer mask 302, 406 remaining on the substrate 100. Alternatively, the organic layer 312, 408 may be deposited on the substrate 100 using a conventional masking technique, such as described with reference to FIG. 1B.

After forming the organic layer 312, 408 on the first inorganic layer 308, 404, the substrate 100 can then be transferred back to the inorganic layer deposition system 606 (or other inorganic layer deposition system 606 of the production line 600) to deposit the second inorganic layer 314, 402 on the organic layer 312, 408 while the polymer mask 302, 406 remains on the substrate 100. After all the inorganic and organic layers 308, 404, 314, 402, 312, 408 are formed on the substrate 100, the substrate 100 can be transferred directly to the a mask layer removal system 612 to remove polymer mask 302, 406 disposed on the substrate 100 if the polymer mask 302, 406 has a sufficient amount of bare polymer material exposed to facilitate an ashing or dissolving process as described above. If the polymer mask 302, 406 is covered by the inorganic layer 308, 404, then the substrate 100 may be transferred to an inorganic layer patterning system 610 to form an opening on the inorganic layers 308, 404, 314, 402, 312, through which the polymer mask 302, 406 may then be ashed or dissolved in the mask layer removal system 612. If necessary, a shell of the inorganic layer left on the substrate after removing the polymer mask layer may be removed as above in an inorganic layer removal system 614. It is noted that more or less of the deposition systems or patterning, etching, or other associated processing system may also be included in the production line 600 to facilitate performing the encapsulation process.

Maskless Encapsulation

As discussed above, organic electronic devices which are typically extremely sensitive to the environment need to be protected by a barrier which avoids the diffusion of moisture or oxygen or other harmful chemicals. In order to be able to connect the device to a power supply and drive electronics it is necessary to remove parts from the protective coating to get access to the contacts. As discussed above, deposition of the barrier coatings can be done via shadow or hard masks, which protect the contact area of the device. The handling and alignment of the hard masks can create technical challenges. The need for periodic cleaning cycles for the masks and the additional hardware related to the mask handling/alignment/storage has a negative impact on the overall cost of ownership (CoO) of the process.

In order to avoid all the challenges related to a hard mask based technology, a maskless process can be utilized. In the maskless process, the encapsulation layers are applied as a blanket coating over the complete substrate. Afterwards, the contact areas are treated with a laser to selectively remove the encapsulation layers and leave a clean area behind.

Figure 7A:
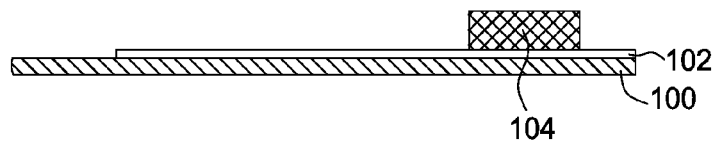
FIGS. 7A-7D illustrate schematic cross-sectional views of an OLED structure during different stages of the encapsulation method of FIG. 8.
Figure 7B:
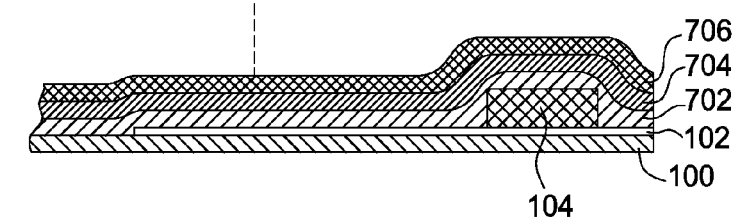
Figure 7C:
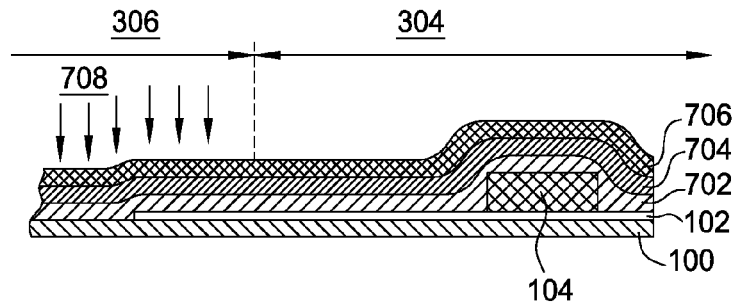
Figure 7D:
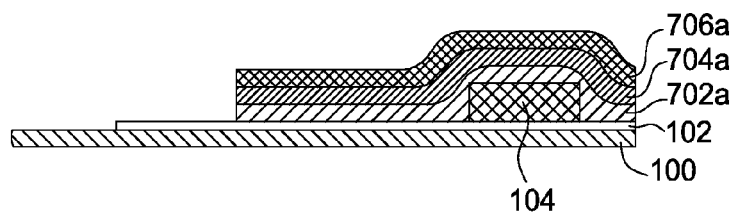
Figure 8:
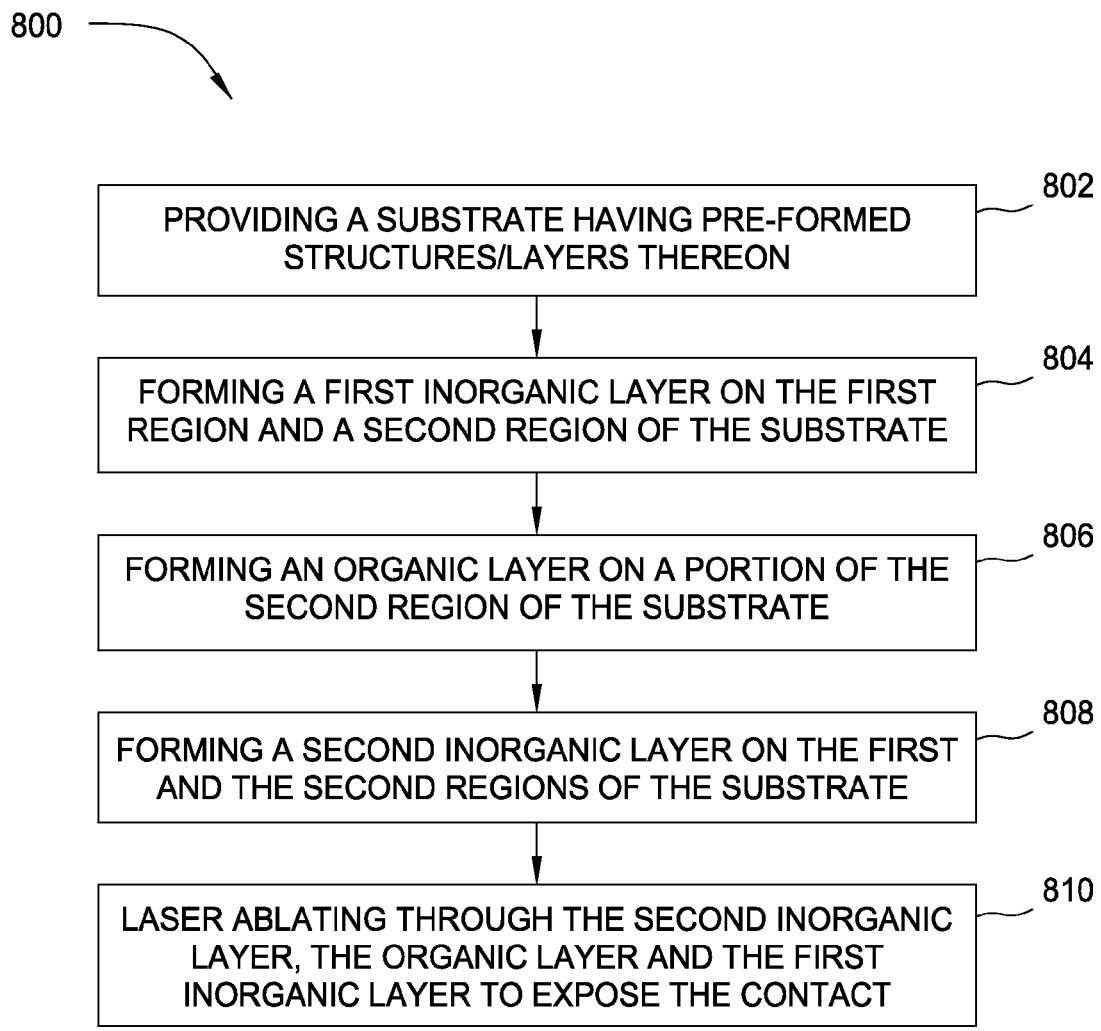
FIG. 8 is a flow diagram of a method for encapsulating an OLED structure in accordance with one embodiment of the present invention.

One technique for removing the barrier layer that is deposited over the contact by direct energy absorption in the material is by using a laser of appropriate frequency. FIGS. 7A-7D illustrate schematic cross-sectional views of an OLED structure during different stages of an encapsulation method 800 of FIG. 8. As shown in FIG. 7A, the substrate 100 is provided with preformed structures thereover (step 802). The preformed structures include the contact layer 102 and the OLED structure 104. Thereover, the first inorganic encapsulation layer 702 is deposited (step 804) followed by the organic encapsulation layer 704 (step 806) and the second inorganic encapsulation layer 706 (step 808) as shown in FIG. 7B. It is to be understood that while the organic encapsulation layer 704 is shown to be blanket deposited over the substrate, the organic encapsulation layer 704 may be selectively deposited as discussed above.

After all of the encapsulating layers have been deposited over the entire substrate 100, the first region 306 is exposed to a laser ablation treatment 708 to expose the contact layer 102 (step 810). The laser ablation may be performed by exposing the encapsulation layers to an ultraviolet laser operating at a repetition rate of between about 180 kHz and about 210 kHz. The spot size of the laser (i.e., the focal width of the laser) may be between about 20 μm and about 150 μm. The laser may remove between about 50 mm/sec to about 5000 mm/sec of encapsulation material when operated at a power level of between about 2 Watts and about 4 Watts. The laser may be spaced between about 5 mm and about 10 mm away from the substrate 100 during the laser ablation process. By blanket depositing the encapsulation layers and then laser ablating the encapsulation layers that are disposed over first region 306, the contact layer 102 may be exposed without the use of any hard masks during the deposition of the encapsulation layers.

It is to be understood that while the description has been made with reference to exposing the encapsulation layers to the laser ablation from the side of the substrate upon which the encapsulation layers are disposed, it is contemplated that the laser ablation may be performed by directing the laser from the other side of the substrate such that the laser passes through the substrate and ablates the encapsulation layers.

Another maskless technique that utilizes lasers to expose the contact layer 102 involves applying a sacrificial organic interlayer between the metal contact and the encapsulation layers. By operating a laser at a frequency which is absorbed in the sacrificial layer the encapsulating layers are indirectly blasted mechanically away, when the organic layer is combusted by the laser. The sacrificial layer can be applied before the OLED structure 104 is formed (e.g., in the front end section of the overall process) or during the OLED structure 104 fabrication process using a material which is used in the OLED structure 104 and has the needed absorption properties.

The sacrificial process operates by either depositing a sacrificial organic layer over the contact layer 102 in the first region 306 (either as a separate layer or as part of the formation of the OLED structure 104). Thereafter, the inorganic and organic encapsulation layers are formed. As discussed above, the inorganic encapsulation layers are blanket deposited and the organic encapsulation layer is either selectively deposited or blanket deposited. Once all of the encapsulation layers have been deposited, a laser is directed at the first region 306. The laser operates at a frequency that is absorbed by the sacrificial organic layer. However, because the laser is directed at the first region 306, the organic material of the OLED structure 104 is not affected because the laser is not directed at the OLED structure 104. The sacrificial organic layer is combusted by the laser. Due to the combustion of the sacrificial organic layer, the encapsulation layers in the first region 306 would be removed and the contact layer 102 would be exposed in the first region 306.

In either technique, a hard mask is not utilized during the encapsulation layer formation which will result in a lower CoO and simplifying the overall fabrication process. Following the removal of the encapsulation layers in the first region 306, the exposed contact layer 102 can cleaned by rinsing, forced air/gas or even wiping to remove any residual encapsulation layer material.

By utilizing a polymer mask during the encapsulation formation process, one time polymer mask formation/deposition process may be obtained, thereby advantageously lowering the manufacturing cost as compared to the conventional two hard mask deposition processes while increasing the manufacturing throughput. Alternatively, by blanket depositing the encapsulating layers and then exposing the encapsulation layers that are over the contact area, the encapsulation layers can be removed to expose the contact layer without use of a hard mask during the deposition process.

While the foregoing is directed to embodiments of the present disclosure, other and further embodiments of the disclosure may be devised without departing from the basic scope thereof, and the scope thereof is determined by the claims that follow.

The invention claimed is:

1. A method for encapsulating a substrate having an OLED structure formed thereover, comprising:
blanket depositing a first encapsulation layer over the substrate, a contact layer positioned over an upper surface the substrate, and an OLED structure positioned on and in physical contact with the contact layer, wherein the contact layer is positioned below the OLED structure and extends out from under the OLED structure, wherein an upper surface of the contact layer comprises a first portion and a second portion, wherein the OLED structure is positioned on the second portion of the contact layer, and
wherein the first encapsulation layer is inorganic; and
depositing a second encapsulation layer over the first encapsulation layer above the OLED structure; and
blanket depositing a third encapsulation layer over the second encapsulation layer, or over both the first encapsulation layer and the second encapsulation layer;
laser ablating at least the first inorganic encapsulation layer to expose the first portion of the upper surface of the contact layer and the upper surface of the substrate.

2. The method of claim 1, wherein the laser ablating is performed with an ultraviolet laser.

3. The method of claim 2, wherein the laser operates at a repetition rate of between about 180 kHz and about 210 kHz.

4. The method of claim 3, wherein the laser has a spot size of the laser of between about 20 μm and about 150 μm.

5. The method of claim 4, wherein the laser removes between about 50 mm/sec to about 5000 mm/sec of material from at least one of the encapsulation layers.

6. The method of claim 5, wherein the laser is operated at a power level of between about 2 Watts and about 4 Watts.

7. The method of claim 6, wherein the laser is spaced between about 5mm and about 10 mm away from the substrate during the laser ablation.

8. The method of claim 1, wherein no masks are utilized during the deposition of the one or more encapsulation layers.

9. A method for encapsulating a substrate having an OLED structure formed thereover, comprising:
- depositing a first inorganic encapsulation layer over the substrate, a contact layer positioned over the substrate, and an OLED structure positioned on and in physical contact with the contact layer, wherein the contact layer is positioned below the OLED structure and extends out from the OLED structure, wherein the contact layer comprises a first portion and a second portion, and wherein the OLED structure is positioned on the second portion of the contact layer;
- depositing an organic encapsulation layer over the first inorganic encapsulation layer;
- depositing a second inorganic encapsulation layer over the first inorganic encapsulation layer; and
- laser ablating at least one of the inorganic encapsulation layers to expose an upper surface of the first portion of the contact layer and an upper surface of the substrate.

10. The method of claim 9, wherein the laser ablating is performed with an ultraviolet laser.

11. The method of claim 10, wherein the laser operates at a repetition rate of between about 180 kHz and about 210 kHz.

12. The method of claim 11, wherein the laser has a spot size of the laser of between about 20 μm and about 150 μm.

13. The method of claim 12, wherein the laser removes between about 50 mm/sec to about 5000 mm/sec of material from at least one of the encapsulation layers.

14. The method of claim 13, wherein the laser is operated at a power level of between about 2 Watts and about 4 Watts.

15. The method of claim 14, wherein the laser is spaced between about 5 mm and about 10 mm away from the substrate during the laser ablation.

16. The method of claim 9, wherein no masks are utilized during the deposition of the first inorganic encapsulation layer, the organic encapsulation layer and the second inorganic encapsulation layer.

* * * * *